(12) United States Patent
Aslan et al.

(10) Patent No.: US 6,765,422 B1
(45) Date of Patent: Jul. 20, 2004

(54) HIGH RESOLUTION FAN CONTROL AT HIGH PWM FREQUENCY WITH A LOW CLOCK FREQUENCY INPUT

(75) Inventors: Mehmet Aslan, Milpitas, CA (US); Richard Henderson, Sunnyvale, CA (US); Chungwai Benedict Ng, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/456,876

(22) Filed: Jun. 5, 2003

(51) Int. Cl.⁷ .................................................. H03K 3/17
(52) U.S. Cl. ...................................... 327/175; 327/124
(58) Field of Search ................................ 327/100, 124, 327/172, 175

(56) References Cited

U.S. PATENT DOCUMENTS 6,023,741 A * 2/2000 Yoshino ..................... 710/100

* cited by examiner

*Primary Examiner*—Kenneth B. Wells
(74) *Attorney, Agent, or Firm*—Merchant & Gould P.C.; Timothy P. Sullivan

(57) ABSTRACT

The present invention enables an IC to have a fast PWM while maintaining the low frequency clock requirement of the temperature measurement. Methods are presented to increase the resolution of the control using a relatively low input clock. According to one method, the numerator and denominator of the PWM duty cycle equation are adjusted to achieve a desired resolution. According to another method, a determined number of PWM cycles are used to set the PWM duty cycle. For example, an averaging of 1024 duty cycles may be used to achieve an increased resolution of the duty cycle as compared to using only one duty cycle. According to yet another method, an error integrating loop is used to determine the level of the next cycle. The number of cycles used to reach the target PWM duty cycle depends on the desired resolution.

21 Claims, 6 Drawing Sheets

ENTER THE FOLLOWING INFORMATION
CLK Divider (Normal PWM Resolution): 16
Target PWM Duty Cycle: 61%
CALCULATED VALUES BELOW THIS LINE
LEVEL_N: 9
LEVEL_N + 1: 10
TARGET PWM: 9.76
AVERAGE PWM AFTER 100 CYCLES: 9.7800
AVERAGE PWM DC(100 CYCLES): 61%

| CYCLE | CUR PWM | CUR ERR | ACC ERR | NEXT PWM |
|---|---|---|---|---|
| 1 | 9 | -0.76 | -0.76 | 10 |
| 2 | 10 | 0.24 | -0.52 | 10 |
| 3 | 10 | 0.24 | -0.28 | 10 |
| 4 | 10 | 0.24 | -0.04 | 10 |
| 5 | 10 | 0.24 | 0.2 | 9 |
| 6 | 9 | -0.76 | -0.56 | 10 |
| 7 | 10 | 0.24 | -0.32 | 10 |
| 8 | 10 | 0.24 | -0.08 | 10 |
| 9 | 10 | 0.24 | 0.16 | 9 |
| 10 | 9 | -0.76 | -0.6 | 10 |
| 11 | 10 | 0.24 | -0.36 | 10 |
| 12 | 10 | 0.24 | -0.12 | 10 |
| 13 | 10 | 0.24 | 0.12 | 9 |
| 14 | 9 | -0.76 | -0.64 | 10 |
| 15 | 10 | 0.24 | -0.4 | 10 |
| 16 | 10 | 0.24 | -0.16 | 10 |
| 17 | 10 | 0.24 | 0.08 | 9 |
| 18 | 9 | -0.76 | -0.68 | 10 |
| 19 | 10 | 0.24 | -0.44 | 10 |
| 20 | 10 | 0.24 | -0.2 | 10 |
| 21 | 10 | 0.24 | 0.04 | 9 |
| 22 | 9 | -0.76 | -0.72 | 10 |
| 23 | 10 | 0.24 | -0.48 | 10 |
| 24 | 10 | 0.24 | -0.24 | 10 |
| 25 | 10 | 0.24 | 5.33E-15 | 9 |
| 26 | 9 | -0.76 | -0.76 | 10 |
| 27 | 10 | 0.24 | -0.52 | 10 |
| 28 | 10 | 0.24 | -0.28 | 10 |
| 29 | 10 | 0.24 | -0.04 | 10 |
| 30 | 10 | 0.24 | 0.2 | 9 |
| 31 | 9 | -0.76 | -0.56 | 10 |
| 32 | 10 | 0.24 | -0.32 | 10 |
| 33 | 10 | 0.24 | -0.08 | 10 |
| 34 | 10 | 0.24 | 0.16 | 9 |
| 35 | 9 | -0.76 | -0.6 | 10 |
| 36 | 10 | 0.24 | -0.36 | 10 |
| 37 | 10 | 0.24 | -0.12 | 10 |
| 38 | 10 | 0.24 | 0.12 | 9 |
| 39 | 9 | -0.76 | -0.64 | 10 |
| 40 | 10 | 0.24 | -0.4 | 10 |
| 41 | 10 | 0.24 | -0.16 | 10 |
| 42 | 10 | 0.24 | 0.08 | 9 |
| 43 | 9 | -0.76 | -0.68 | 10 |
| 44 | 10 | 0.24 | -0.44 | 10 |
| 45 | 10 | 0.24 | -0.2 | 10 |
| 46 | 10 | 0.24 | 0.04 | 9 |
| 47 | 9 | -0.76 | -0.72 | 10 |
| 48 | 10 | 0.24 | -0.48 | 10 |
| 49 | 10 | 0.24 | -0.24 | 10 |
| 50 | 10 | 0.24 | 1.07E-14 | 9 |
| 51 | 9 | -0.76 | -0.76 | 10 |
| 52 | 10 | 0.24 | -0.52 | 10 |
| 53 | 10 | 0.24 | -0.28 | 10 |
| 54 | 10 | 0.24 | -0.04 | 10 |
| 55 | 10 | 0.24 | 0.2 | 9 |
| 56 | 9 | -0.76 | -0.56 | 10 |
| 57 | 10 | 0.24 | -0.32 | 10 |
| 58 | 10 | 0.24 | -0.08 | 10 |
| 59 | 10 | 0.24 | 0.16 | 9 |
| 60 | 9 | -0.76 | -0.6 | 10 |
| 61 | 10 | 0.24 | -0.36 | 10 |
| 62 | 10 | 0.24 | -0.12 | 10 |
| 63 | 10 | 0.24 | 0.12 | 9 |
| 64 | 9 | -0.76 | -0.64 | 10 |
| 65 | 10 | 0.24 | -0.4 | 10 |
| 66 | 10 | 0.24 | -0.16 | 10 |
| 67 | 10 | 0.24 | 0.08 | 9 |
| 68 | 9 | -0.76 | -0.68 | 10 |
| 69 | 10 | 0.24 | -0.44 | 10 |
| 70 | 10 | 0.24 | -0.2 | 10 |
| 71 | 10 | 0.24 | 0.04 | 9 |
| 72 | 9 | -0.76 | -0.72 | 10 |
| 73 | 10 | 0.24 | -0.48 | 10 |
| 74 | 10 | 0.24 | -0.24 | 10 |
| 75 | 10 | 0.24 | 1.6E-14 | 9 |
| 76 | 9 | -0.76 | -0.76 | 10 |
| 77 | 10 | 0.24 | -0.52 | 10 |
| 78 | 10 | 0.24 | -0.28 | 10 |
| 79 | 10 | 0.24 | -0.04 | 10 |
| 80 | 10 | 0.24 | 0.2 | 9 |
| 81 | 9 | -0.76 | -0.56 | 10 |
| 82 | 10 | 0.24 | -0.32 | 10 |
| 83 | 10 | 0.24 | -0.08 | 10 |
| 84 | 10 | 0.24 | 0.16 | 9 |
| 85 | 9 | -0.76 | -0.6 | 10 |
| 86 | 10 | 0.24 | -0.36 | 10 |
| 87 | 10 | 0.24 | -0.12 | 10 |
| 88 | 10 | 0.24 | 0.12 | 9 |
| 89 | 9 | -0.76 | -0.64 | 10 |
| 90 | 10 | 0.24 | -0.4 | 10 |
| 91 | 10 | 0.24 | -0.16 | 10 |
| 92 | 10 | 0.24 | 0.08 | 9 |
| 93 | 9 | -0.76 | -0.68 | 10 |
| 94 | 10 | 0.24 | -0.44 | 10 |
| 95 | 10 | 0.24 | -0.2 | 10 |
| 96 | 10 | 0.24 | 0.04 | 9 |
| 97 | 9 | -0.76 | -0.72 | 10 |
| 98 | 10 | 0.24 | -0.48 | 10 |
| 99 | 10 | 0.24 | -0.24 | 10 |
| 100 | 10 | 0.24 | 2.13E-14 | 9 |

*Fig. 5*

HIGH RESOLUTION FAN CONTROL AT HIGH PWM FREQUENCY WITH A LOW CLOCK FREQUENCY INPUT

FIELD OF THE INVENTION

The present invention relates to electronic circuits, and more specifically to a system for controlling a fan.

BACKGROUND OF THE INVENTION

To achieve high resolution fan control, the system controlling the fan needs to be able to adjust the fan speed at a high resolution. One way to achieve this is by adjusting the Pulse Width Modulation (PWM) Duty Cycle to get the desired fan speed.

The preferred PWM frequency (driving the fan) is above 20 KHz with a variable duty cycle for adjusting the fan speed. The minimum 20 KHz frequency is chosen because the audio range of human is from 200 Hz up to possibly 20 KHz. Therefore, any frequency above 20 KHz is typically not heard.

For most thermal management solutions in a system, the fan speed is determined primarily by temperature inputs of the system. Thermal Management Systems usually require relatively lower frequency clock (hundreds of KHz typically) due to noise and power consumption requirements. This clock frequency does not allow enough resolution (8-bit or more) for relatively high frequency (greater than 20 KHz) PWM fan control.

Typical solutions require faster clock frequency for high resolution high frequency PWM. What is needed is a way to generate a high resolution high frequency PWM signal with a low input clock frequency.

BRIEF DESCRIPTION OF THE DRAWINGS

FIG. 5 illustrates an exemplary table illustrating one hundred cycles of operation of the error integrating loop.

DETAILED DESCRIPTION OF THE PREFERRED EMBODIMENT

Figure 1:
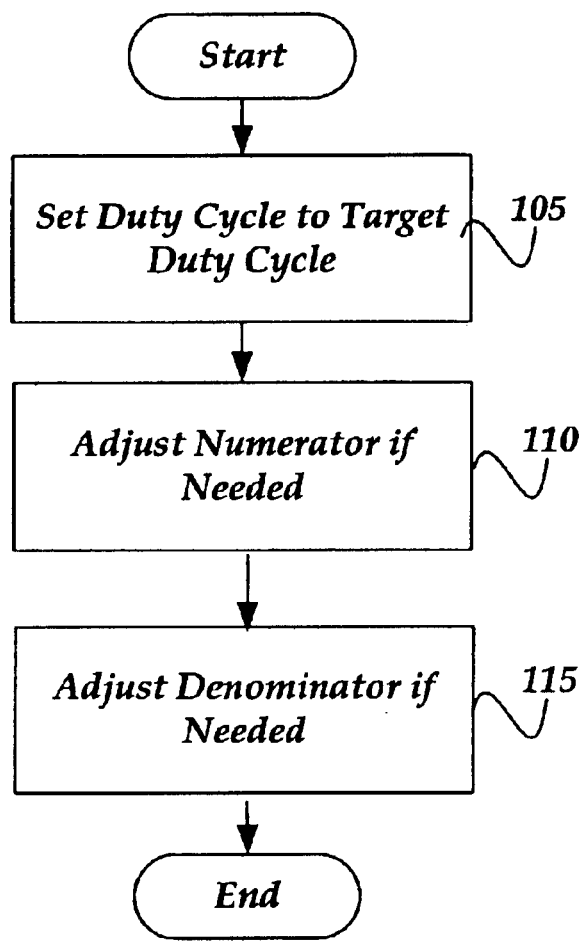
FIG. 1 illustrates a process for adjusting the numerator and denominator in a PWM duty cycle for high resolution fan control with a relatively low input clock frequency.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The terms "comprising," "including," "containing," "having," and "characterized by," mean an open-ended or inclusive transitional construct and does not exclude additional, unrecited elements, or method steps. For example, a combination that comprises A and B elements, also reads on a combination of A, B, and C elements.

The present invention is directed at enabling an IC to have a fast PWM in the control loop while maintaining the low frequency clock requirement of the Temperature measurement. Methods are presented to increase the resolution of the control using a relatively low input clock frequency. According to one embodiment, the numerator and denominator of the PWM duty cycle equation are adjusted to achieve a desired resolution. According to another embodiment, more PWM cycles are used to set the PWM duty cycle. For example, instead of using one PWM cycle, 1024 cycles are used with varying duty cycles. According to yet another embodiment, an error integrating loop is used to determine the next cycle. The number of cycles used to reach the target PWM depends on the desired resolution.

In one example, the fan control IC monitors the Revolutions Per Minute (RPM) and adjusts the PWM correspondingly. The same PWM duty cycle driving the fan does not result in the same fan speed (in RPM) over time since higher PWM duty cycle is needed to get the same RPM as the fan ages, in general.

In temperature sensors, the clock frequency is limited due to noise and power considerations within the chip. The limited clock frequency results in only being able to count up to 16 with a 360 KHz clock when the PWM frequency is above 20 KHz (360/20). This limited count reduces the precision.

FIG. 1 illustrates a process for adjusting the numerator and denominator in a PWM duty cycle for high resolution fan control with a relatively low input clock frequency, according to one embodiment of the invention. For purposes of this example, assume that a 360 KHz clock is used and the PWM frequencies range from 180 KHz to 20 KHz.

After a start block, the process flows to block 105, where the $PWM_{duty\_cycle}$ is set based on a target duty cycle. Generally, the method works by setting different duty cycles by incrementing and decrementing both the denominator and numerator in the PWM duty cycle equation below.

$$PWM_{duty\_cycle} = \frac{numerator}{denominator}$$

$$= \frac{n}{w} \text{ where } n \text{ ranges from 1 to } m,$$

and $m$ ranges from 2 to 18.

As can be seen by referring to the equation, the PWM frequencies will vary when varying the denominator, but the resolution of the control is significantly finer than keeping the PWM frequency fixed.

Transitioning to block 110, the numerator of the $PWM_{duty\_cycle}$ equation is adjusted if required. Keeping the denominator the same implies the frequency remains unchanged. The numerator determines the duty cycle.

Flowing to block 115, the denominator of the $PWM_{duty\_cycle}$ equation is adjusted if needed. To increase the resolution then changing the denominator will vary the frequency as well as the duty cycle, but the difference of the duty cycle may be smaller than the ones with a fixed denominator.

The following example will be used to clarify operation of the method.

Assume the current duty cycle is ($PWM_{duty\_cycle}=7/15=46.67\%$) and the target duty cycle of 47.05% is needed to slightly increase the RPM of the fan. What is needed is a way to increase the $PWM_{duty\_cycle}$. If the standard step size is used (1/15), however, then the RPM will jump too much, thereby causing the RPM of the fan to be faster than the desired one. By incrementing the numerator only, the PWM will increase by 1/15, or 6.66%. This may be expressed as: $PWM_{duty\_cycle}=8/15=53.33\%$ which is 46.67% +1/15.

As can be seen, this is an increase of over 6%, which will cause the RPM to increase too much. In order to obtain a finer resolution, the denominator and numerator of the equation are adjusted. By changing both the denominator and numerator, the resolution of the PWM duty cycle is increased. For example by increasing the numerator by one (1) and the denominator by two (2), the $PWM_{duty\_cycle}$ may be increased by 0.39% instead of the 6.66% increase by only adjusting the numerator. This maybe expressed as:

$PWM_{duty\_cycle}=8/17=47.06\%$ which is 0.39% increment of the $PWM_{duty\_cycle}$ According to this particular example, the first eight cycles of the PWM are high and the last nine cycles are low. In this case, the frequency of the PWM changes from 24 KHz to 21.18 KHz. The 21.18 KHz is still above the desired 20 KHz level. According to this example, the increments of the duty cycle vary roughly from 0.35% to 2%, except for the percentages around 0%, 33%, 50%, 66%, and 100%. As can be seen, finer resolutions may be achieved, but there are certain percentages where changing the numbers may not obtain the desired resolution.

Figure 2:
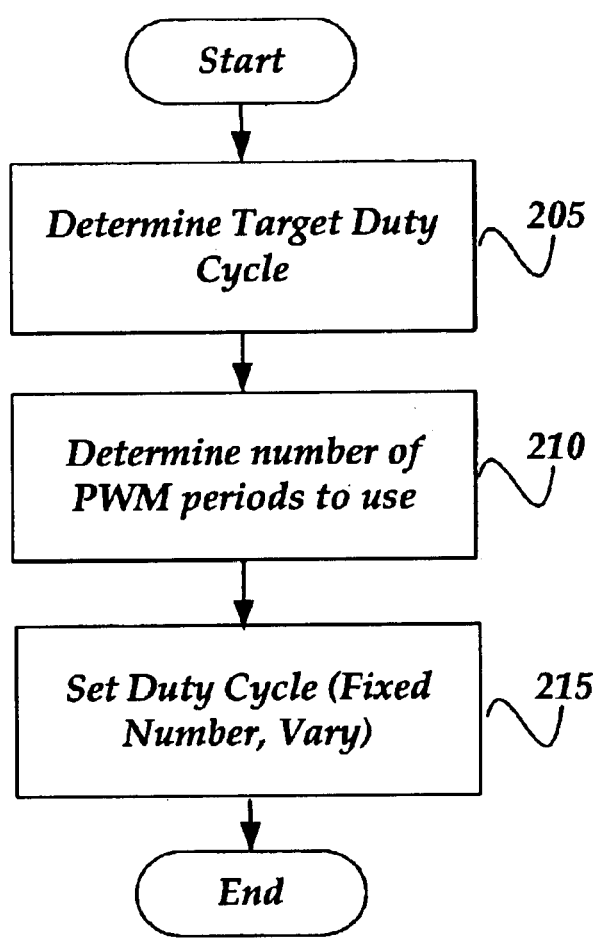
FIG. 2 illustrates a method of increasing the resolution of the duty cycle by increasing the number of PWM periods used in setting the cycle.

FIG. 2 illustrates a method of increasing the resolution of the duty cycle by increasing the number of PWM periods used in setting the cycle, according to an embodiment of the invention.

After a start block, the process flows to block 205 where a target duty cycle is determined. According to one embodiment of the invention, the target duty cycle is selected such that the measured RPM of the fan will be close to the desired RPM of the fan.

Transitioning to block 210, the process determines the number of PWM periods to use. According to one embodiment of the invention, the number of PWM periods is preset based on the finest resolution desired. According to another embodiment, the number of PWM periods to use may be calculated based on the resolution required to match the desired RPM of the fan. Other ways may also be used to select the number of periods to use.

For explanation purposes, assume that there is a fixed clock period of up to eighteen (18) internal clocks of a 360 KHz (20 KHz frequency of PWM). This makes the resolution of the increments 5.56% for the duty cycle. The resolution may be made finer by increasing the number of PWM periods used.

Using a higher number of PWM periods, however, can make the resolution much finer. For instance, assuming the period of a PWM pulse is 16 internal clocks (22.5 KHz frequency of PWM), and $2^n$ number of cycles where n is 10 are used, then the duty cycle can be expressed as follows:

$PWM_{duty\_cycle}=k/(18 \times 1024)$ where the duty cycle resolution is 0.006%.

The duty cycle will have the resolution of 0.006% for 1024 clocks. In other words, the total high time of the PWM signal over a period of 1024 PWM pulses is used, rather than just 1 PWM cycle.

Next, at block 215 the duty cycle is set. The count may be expanded or decreased over the number of PWM periods selected depending on the desired resolution. The more PWM periods used, the finer the resolution. For example, for 1024 PWM Pulses this would be to count over 64 cycles of 16 then you are up to 1024 cycles. The number of clock periods can change. The resolution increases with the number of clock periods selected for the denominator.

Setting the cycle to high or low may be selected in many different ways. For example, a fixed number of cycles where the cycle will be high and then leave the remainder to the final period may be used. The number of cycles may also be varied over the number of clock periods.

The following example will be used to further clarify this method.

Assuming that the frequency of the PWM is 22.5 KHz (16 internal clock periods for a 360 KHz clock), the number of PWM periods to generate the target duty cycle is 1024 ($2^{10}$) and the current PWM duty cycle be 75% then the duty cycle for the 1024 PWM pulses will all be 75% (12/16).

To increase the duty cycle slightly by 0.006% to 75.006%, one out of the 1024 PWM pulses is selected to have an 81.25% duty cycle while the remaining 1023 pulses have a 75% duty cycle. This provides an average duty cycle of 75.006% for the 1024 PWM pulses.

To increase the duty cycle again by 0.006% to 75.012%, a second PWM pulse is inserted with duty cycle of 81.25% so that 2 out of the 1024 PWM pulses have 81.25% duty cycles providing an average duty cycle of 75.012% for the 1024 PWM pulses. According to one embodiment of the invention, the 2 PWM pulses are evenly distributed among the 1024 PWM pulses. For example, the 512th and 1024th can be the ones with 81.25% duty cycle while the rest all have 75%.

If the target duty cycle keeps going up gradually to 78.125%, then there will be 512 PWM pulses with 75% duty cycle and 512 PWM pulses with 81.25% duty cycle. To evenly distribute them, every other PWM pulse will be 75% and 81.25% out of the 1024 PWM pulses.

Figure 3:
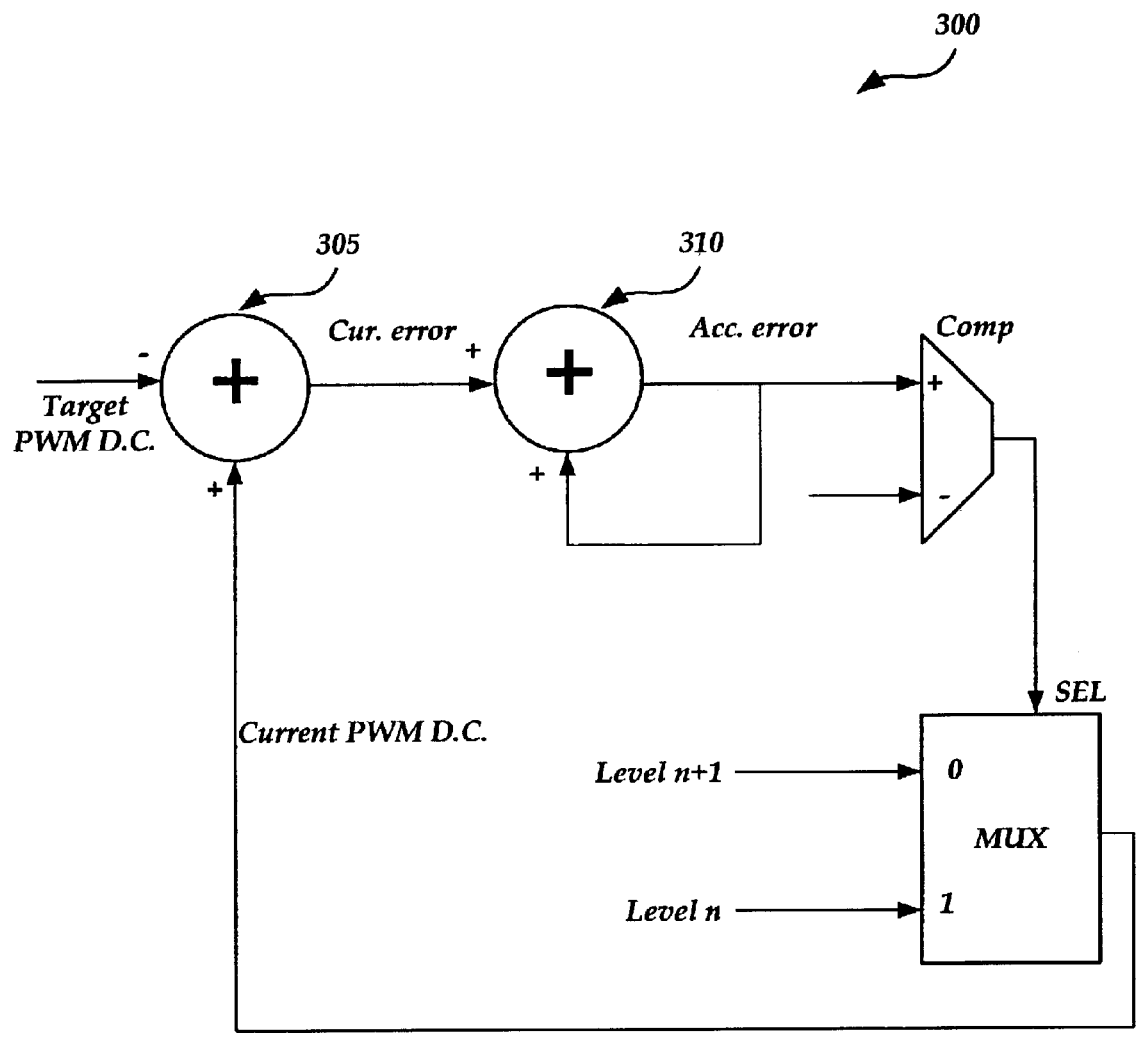
FIG. 3 illustrates a block diagram for obtaining a finer resolution using an error integrating loop.

FIG. 3 illustrates a block diagram for obtaining a finer resolution using an error integrating loop, according to one embodiment of the invention. According to prior art methods, in order to achieve a PWM signal of 22.5 KHz at a 1% resolution would require a 2.25 MHz clock. An error integrating loop, however, may be used with a slower clock, to achieve the same, or finer, resolution.

As illustrated in the figure, error integrating loop 300 includes accumulators 305 and 310, a comparator (Comp) and a multiplexer (MUX).

The operation of error integrating loop 300 will now be described by way of an example. Assume the Target PWM D.C is 61% which is equal to $9.76/16$ (using a 360 KHz clock). Generally, the error integrating loop will alternate between 9s and 10s to generate the 9.76. According to another embodiment, the error integrating loop switches among different levels.

The finer the resolution desired, the longer the number of cycles to achieve the result. Level n=9, level n+1=10. Assuming the current PWM D.C. level is 9 then it is 0.76 below the target PWM D.C. of 9.76. At this point the accumulated error is –0.76. According to one embodiment, the comparator is configured to compare the accumulated error to zero, and when larger than or equal to zero, output zero, otherwise output a one. The comparator may be configured in other ways. For example, the comparator may be configured to output a one when equal to or below zero, otherwise output a zero. According to this particular example, the comparator outputs a zero (since the acc.error is <0) causing the MUX to select the next level (level n+1) setting the current PWM D.C. for the next cycle to be 10. This process repeats until the desired resolution is reached. The following table illustrates the first eight loops using the method described.

TABLE 1

| Current PWM D.C. | Current Error | Accumulated Error | Next PWM DC |
|---|---|---|---|
| 9 | –0.76 | –0.76 | 10 |
| 10 | +0.24 | –0.52 | 10 |
| 10 | +.24 | –0.28 | 10 |
| 10 | +.24 | –0.04 | 10 |
| 10 | +0.24 | +0.20 | 9 |
| 9 | –0.76 | –0.56 | 10 |
| 10 | +0.24 | –0.32 | 10 |
| 10 | +0.24 | –0.08 | 10 |
| 10 | | | |

The levels (level n and n+1) may be varied to avoid "too quiet" waveforms. In other words, the levels may be varied to avoid too many level n's or n+1's from appearing in a row.

Figure 4:
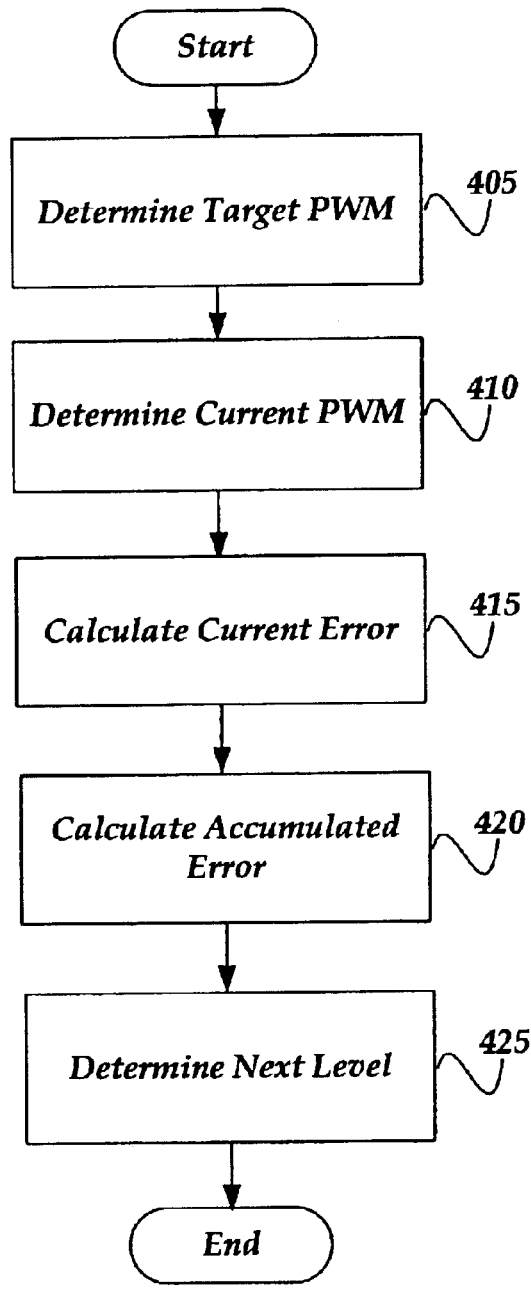
FIG. 4 illustrates a process showing operation of a loop of the error integrating loop.

FIG. 4 illustrates a process showing operation of a loop of the error integrating loop, in accordance with aspects of the invention. After a start block, the process flows to block 405 where the target PWM is determined. Flowing to block 410, the current PWM is determined. Moving to block 415, the current error is calculated. The current error is the difference between the current PWM and the target PWM. Next, the accumulated error is calculated. Transitioning to block 425, the next level for the PWM is determined. According to one embodiment of the invention, the next level is determined by making a comparison between the accumulated error and zero. When the accumulated error is greater than or equal to zero then the next level is selected (level n+1) for the next loop, otherwise the level used in the current loop. This process may continue until the desired resolution is achieved. The process then steps to an end block and returns to processing other actions.

FIG. 5 illustrates an exemplary table illustrating one hundred cycles of operation of the error integrating loop, in accordance with aspects of the invention. According to this particular example, the normal PWM resolution is 16, and the target PWM duty cycle is 61%. Alternating between levels 9 and 10 it can be seen that after one hundred cycles, the error is 2.13E−14.

For the same example with the duty cycle of 56.3125%, this results in the first 100 PWM cycles containing 99 PWM cycles at level $9/16$ and 1 PWM cycle at level $10/16$. This in effect slows down the output response and requires more filtering. In order to avoid this effect, the levels may be expanded.

Figure 6:
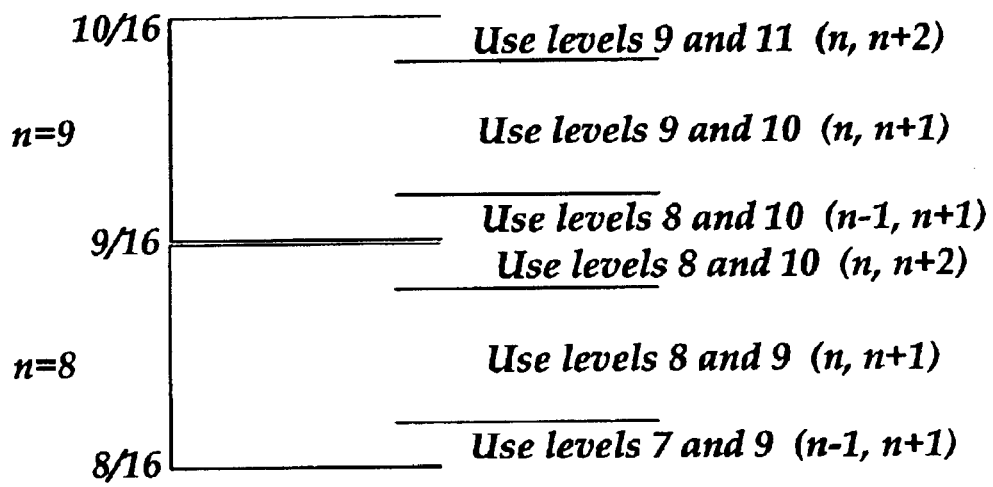
FIG. 6 illustrates an exemplary selected ranges, according to an embodiment of the invention.

FIG. 6 illustrates an exemplary selected ranges, according to an embodiment of the invention. As illustrated in the figure, levels 7 through 11 are used depending on where the target PWM occurs.

The levels may be changed to encompass more or less ranges. According to one embodiment, the levels are chosen to include level n−1, level n, and level n+1. For the same example with the duty cycle of 56.3125%, this results in a roughly equal distribution and includes $8/16$ and $10/16$. Similarly, this could apply if the target is just below $10/16$. The ranges may also overlap.

A pseudo-random sequence may also be used to further randomize the output pattern. A noise signal, such as a (+/−) 1 signal, could be used that adds to zero over time to randomize the output pattern.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method for high resolution fan control at a high PWM frequency with a low clock frequency input, comprising:

determining a target PWM duty cycle and a current PWM duty cycle;

adjusting a numerator of the $\text{PWM}_{duty\_cycle}$ equation when determined; and adjusting the denominator of the $\text{PWM}_{duty\_cycle}$ equation when determined.

2. A method for high resolution fan control at a high PWM frequency with a low clock frequency input, comprising:

determining a target PWM duty cycle and a current PWM duty cycle;

determining a number of PWM periods to use to achieve a desired resolution; and setting the duty cycle using the determined number of PWM periods.

3. The method of claim 2, wherein determining the number of PWM periods to use to achieve the desired resolution, further comprises setting the number of PWM periods to a fixed number of PWM periods.

4. The method of claim 2, wherein determining the number of PWM periods to use to achieve the desired resolution, further comprises setting the number of PWM periods to a varying number of PWM periods depending on the current PWM and the target PWM.

5. The method of claim 2, wherein setting the duty cycle further comprises setting at least two different duty cycles to be used throughout the PWM periods.

6. The method of claim 2, wherein setting the duty cycle further comprises distributing at least two different duty cycles to be used throughout the PWM periods.

7. A method for high resolution fan control at a high PWM frequency with a low clock frequency input, comprising:

determining a target PWM duty cycle and a current PWM duty cycle;

calculating an accumulated error;

determining a next level based on the accumulated error; and setting the next level to the determined next level.

8. The method of claim 7, further comprising calculating a current error which is based on the target PWM duty cycle and the current PWM duty cycle.

9. The method of claim 7, wherein determining the next level based on the accumulated error further comprises comparing the accumulated error to a value; and based upon the comparison determining the next level.

10. The method of claim 9, wherein comparing the accumulated error to the value, further comprises comparing the value to zero, and when the accumulated is greater than or equal zero determining the next level to be level n+1, otherwise determining the next level to be level n.

11. The method of claim 9, wherein determining the next level further comprises selecting the next level from a range of levels.

12. The method of claim 9, further comprising randomizing an output pattern based on a set of the determined next levels.

13. An apparatus for high resolution fan control at a high PWM frequency with a low clock frequency input, comprising:

an accumulator configured to calculate and output an accumulated error between a target PWM signal and a current PWM signal;

a comparator configured to compare the accumulated error to a value; and in response to the comparison output a value relating to the next level; and a MUX configured to set the next level based on the output of the comparator.

14. The apparatus of claim 13, wherein the next level may be selected from an increased level, a decreased level, and a current level.

15. The apparatus of claim 14, wherein the comparator is further configured to determine when the accumulated error is negative, and when outputting a value indicating to increase the next level.

16. The apparatus of claim 14, wherein the comparator is further configured to determine when the accumulated error is positive, and when outputting a value indicating to keep the next level the current level.

17. The apparatus of claim 14, wherein the MUX is further configured to select a next level from a range of levels.

18. An apparatus for high resolution fan control at a high PWM frequency with a low clock frequency input, comprising:

means for determining a target PWM duty cycle and a current PWM duty cycle; and means for adjusting a $PWM_{duty\_cycle}$ to obtain a desired resolution that may not be achieved by maintaining a constant duty cycle.

19. The apparatus of claim 18, wherein the means for adjusting the $PWM_{duty\_cycle}$, further comprises means for calculating an accumulated error;

means for determining a next level based on the accumulated error; and means for setting the next level to the determined next level.

20. The apparatus of claim 18, wherein the means for adjusting the $PWM_{duty\_cycle}$, further comprises means for determining a number of PWM periods to use to achieve the desired resolution; and means for adjusting the duty cycle using the determined number of PWM periods.

21. The apparatus of claim 18, wherein the means for adjusting the $PWM_{duty\_cycle}$, further comprises means for adjusting a numerator and a denominator of a $PWM_{duty\_cycle}$ equation.

* * * * *